(12) United States Patent
Tsai et al.

(10) Patent No.: US 9,984,965 B2
(45) Date of Patent: May 29, 2018

(54) INDUCTOR SYSTEM AND METHOD

(71) Applicant: Taiwan Semiconductor Manufacturing Company, Ltd., Hsinchu (TW)

(72) Inventors: Hao-Yi Tsai, Hsinchu (TW); Hsien-Wei Chen, Hsinchu (TW); Hung-Yi Kuo, Taipei (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/804,407

(22) Filed: Nov. 6, 2017

(65) Prior Publication Data

US 2018/0076135 A1   Mar. 15, 2018

Related U.S. Application Data

(60) Continuation of application No. 15/589,821, filed on May 8, 2017, now Pat. No. 9,812,392, which is a continuation of application No. 15/225,344, filed on Aug. 1, 2016, now Pat. No. 9,647,054, which is a division of application No. 14/182,116, filed on Feb. 17, 2014, now Pat. No. 9,406,739.

(60) Provisional application No. 61/783,416, filed on Mar. 14, 2013.

(51) Int. Cl.
*H01L 23/522* (2006.01)
*H01L 29/06* (2006.01)
*H01L 27/06* (2006.01)
*H01L 27/08* (2006.01)
*H01L 23/58* (2006.01)
*H01L 21/768* (2006.01)
*H01L 21/311* (2006.01)
*H01L 49/02* (2006.01)

(52) U.S. Cl.
CPC .... *H01L 23/5227* (2013.01); *H01L 21/31144* (2013.01); *H01L 21/76802* (2013.01); *H01L 21/76877* (2013.01); *H01L 23/585* (2013.01); *H01L 27/0688* (2013.01); *H01L 27/08* (2013.01); *H01L 28/10* (2013.01); *H01L 29/0619* (2013.01); *H01L 2924/0002* (2013.01)

(58) Field of Classification Search
CPC ...................... H01L 23/5227; H01L 21/31144
See application file for complete search history.

(56) References Cited

U.S. PATENT DOCUMENTS

| | | |
|---|---|---|
| 2003/0038372 A1 | 2/2003 | Sasaki et al. |
| 2005/0051869 A1 | 3/2005 | Watanabe |
| 2005/0104158 A1 | 5/2005 | Bhattacharjee et al. |
| 2009/0146252 A1 | 6/2009 | Huang et al. |
| 2009/0273429 A1 | 11/2009 | Nakamura et al. |
| 2010/0295648 A1 | 11/2010 | Huang et al. |

*Primary Examiner* — Errol Fernandes
(74) *Attorney, Agent, or Firm* — Slater Matsil, LLP

(57) ABSTRACT

A system and method for providing and manufacturing an inductor is provided. In an embodiment similar masks are reutilized to form differently sized inductors. For example, a two turn inductor and a three turn inductor may share masks for interconnects and coils, while only masks necessary for connections between the interconnects and coils may need to be newly developed.

20 Claims, 22 Drawing Sheets

INDUCTOR SYSTEM AND METHOD

This application is a continuation of U.S. patent application Ser. No. 15/589,821, filed on May 8, 2017, and entitled, "Inductor System and Method," which application is a continuation of U.S. patent application Ser. No. 15/225,344, filed on Aug. 1, 2016, and entitled, "Inductor System and Method," now U.S. Pat. No. 9,647,054, issued on May 9, 2017, which application is a division of U.S. patent application Ser. No. 14/182,116, filed on Feb. 17, 2014, and entitled, "Inductor System and Method," now U.S. Pat. No. 9,406,739, issued on Aug. 2, 2016, which application claims priority to U.S. Provisional Application No. 61/783,416, filed on Mar. 14, 2013, and entitled "Inductor System and Method," which applications are incorporated herein by reference.

BACKGROUND

Generally, an inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Inductors may be utilized in a wide variety of applications. For example, inductors may be manufactured and used in mobile devices to receive and filter incoming signals which may then be passed on for further processing. However, because mobile devices may be used in different locations, and these different locations may have different parameters (e.g., frequency bands) used to communicate, the inductors are generally designed for use in a particular geographic region.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the embodiments provides many applicable inventive concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely an inductor for use in mobile semiconductor devices. The embodiments may also be applied, however, to other inductors and other processes of manufacturing.

Figure 1A:
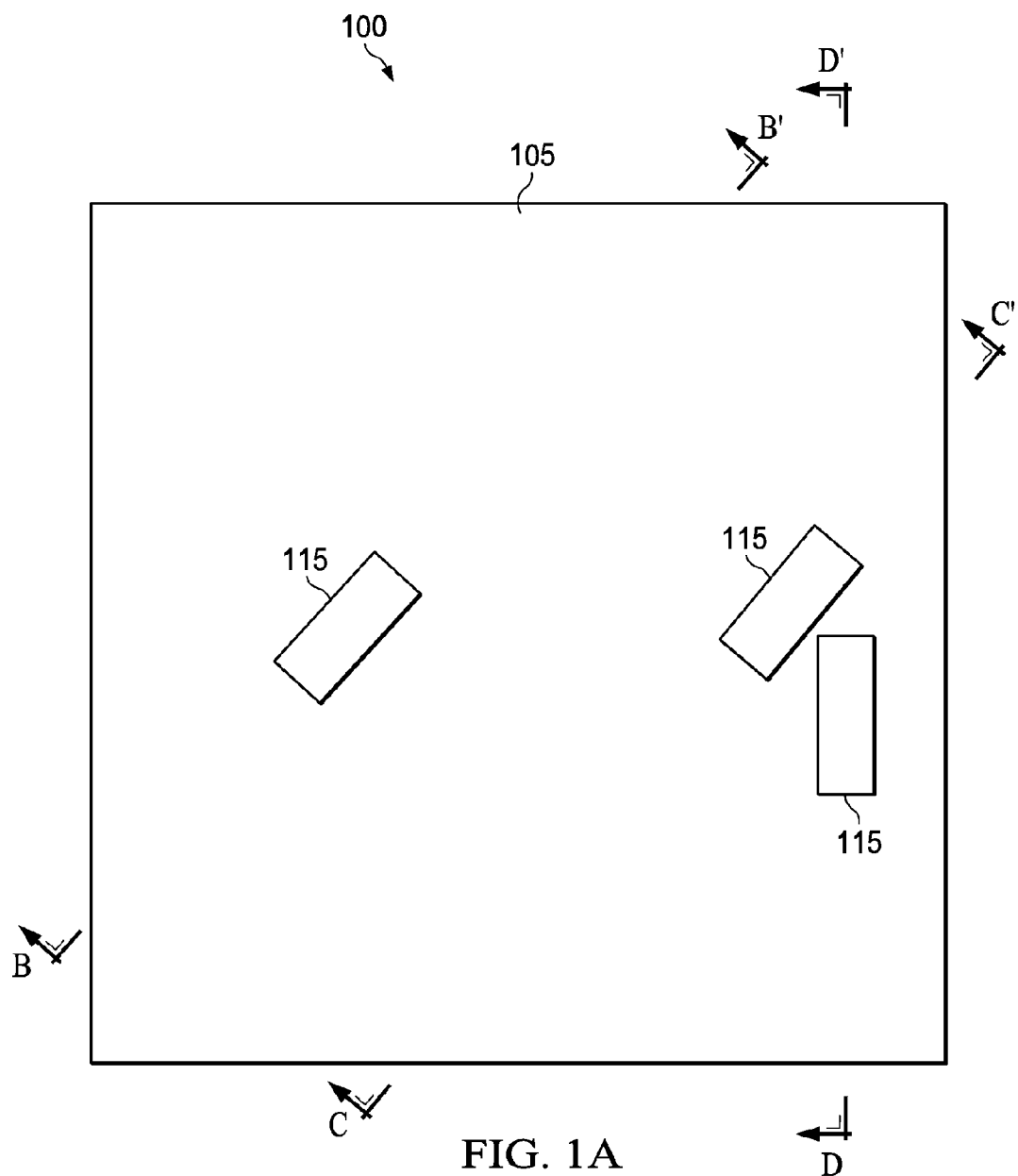
FIGS. 1A-1D illustrate a first mask used to manufacture interconnects in accordance with an embodiment.
Figure 1B:
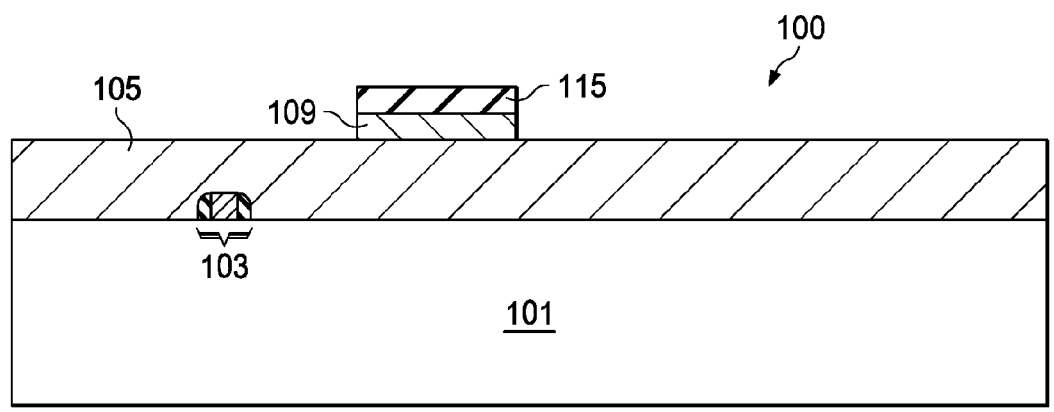
Figure 1C:
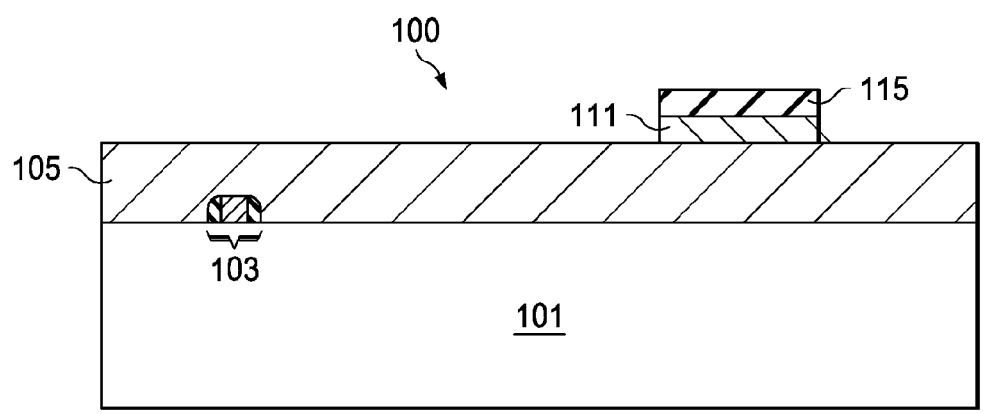
Figure 1D:
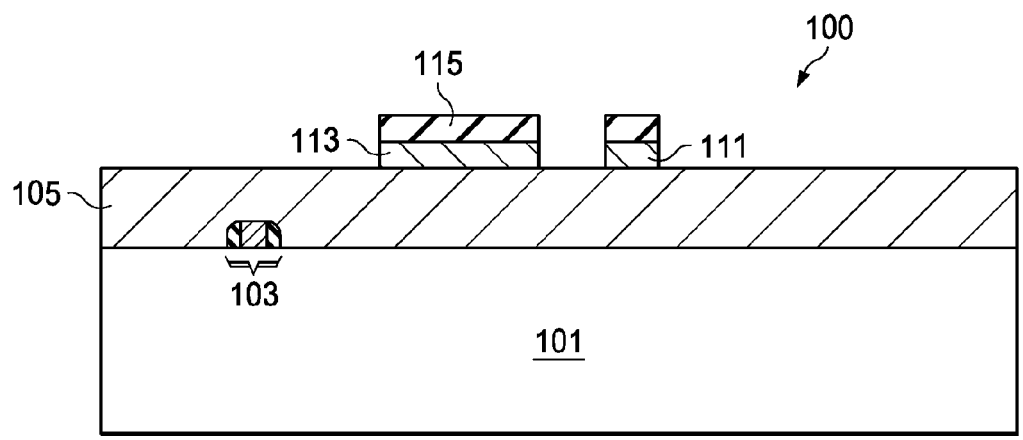

With reference now to FIGS. 1A-1D, wherein FIGS. 1B, 1C, and 1D illustrate cross sectional views of FIG. 1A along lines B-B', C-C', and D-D', respectively, there is shown a portion of a semiconductor die 100 including a semiconductor substrate 101, active devices 103, intermediate metallization layers 105, a first interconnect 109, a second interconnect 111, and a third interconnect 113. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 101 may include the active devices 103. As one of ordinary skill in the art will recognize, a wide variety of active devices and passive devices such as transistors, capacitors, resistors, combinations of these, and the like may be used to generate the desired structural and functional requirements of the design for the semiconductor die 100. The active devices 103 may be formed using any suitable methods.

The semiconductor substrate 101 may also include intermediate metallization layers 105. The intermediate metallization layers 105 may be formed over the active devices and are designed to connect the various active devices to form functional circuitry. The intermediate metallization layers 105 may be formed of alternating layers of dielectric (e.g., low-k dielectric material) and conductive material (e.g., copper) and may be formed through any suitable process (such as deposition, damascene, dual damascene, etc.).

The first interconnect 109, the second interconnect 111, and the third interconnect 113 may be formed over the intermediate metallization layers 105. The first interconnect 109, the second interconnect 111, and the third interconnect 113 may be used to interconnect the various turns or coils of the first inductor 400 (not illustrated in FIGS. 1A-1D but illustrated and discussed below with respect to FIGS. 4A-4D). The first interconnect 109, the second interconnect 111, and the third interconnect 113 may comprise a conductive material such as aluminum, but other conductive materials, such as copper, may alternatively be used. The first interconnect 109, the second interconnect 111, and the third interconnect 113 may be formed using a deposition process, such as sputtering, to form a layer of material (not shown) and portions of the layer of material may then be removed through a suitable process (such as photolithographic masking and etching) to form the first interconnect 109, the second interconnect 111, and the third interconnect 113. The first interconnect 109, the second interconnect 111, and the third interconnect 113 may be formed to have a thickness of between about 4 µm and about 10 µm, such as about 7 µm.

In an embodiment the photolithographic masking and etching process utilizes a first mask 115. In an embodiment the first mask 115 may be, e.g., a photoresist composition which may be placed on the layer of material for the first interconnect 109, the second interconnect 111, and the third interconnect 113. Once in place, the photoresist composition may be patterned into the first mask 115 by exposing the photoresist composition to a radiation such as light in order to activate photoactive chemicals that may make up one component of the photoresist composition. A positive developer or a negative developer may then be used to remove either the exposed photoresist (for a negative development) or to remove the non-exposed photoresist (for a positive development) to form a patterned photoresist.

However, a photoresist composition is not the only material that may be used for the first mask 115. In alternative embodiments the first mask 115 may be a hard mask made of a material such as silicon nitride. Such a hard mask may be formed by chemical vapor deposition and then patterned using, e.g., a photolithographic technique. Any suitable materials or processes may be utilized to form the hard mask, and all such materials and processes are fully intended to be included within the scope of the embodiments.

Once the first mask 115 has been formed, the first interconnect 109, the second interconnect 111, and the third interconnect 113 may be constructed by removing exposed portions of the layer of material for the first interconnect 109, the second interconnect 111, and the third interconnect 113 that are left exposed by the first mask 115. In an embodiment the layer of material may be removed using, e.g., an etching process with the patterned photoresist acting as an etching mask. However, any suitable process may alternatively be utilized.

Once the removal of the layer of material has been completed to form the first interconnect 109, the second interconnect 111, and the third interconnect 113, the first mask 115 may be removed. For example, in an embodiment in which the first mask 115 is a photoresist, the first mask 115 may be removed using an ashing process, whereby the temperature of the photoresist is increased until a thermal decomposition occurs, allowing the photoresist to be easily removed. However, any other suitable removal process, such as an etching process, may alternatively be utilized.

Additionally, while the material and methods discussed are suitable to form the conductive material, these materials are merely exemplary. Any other suitable materials, such as tungsten, and any other suitable processes of formation, such as electroplating or CVD, may alternatively be used to form the first interconnect 109, the second interconnect 111, and the third interconnect 113. Additionally, the precise placement of the first interconnect 109, the second interconnect 111, and the may also be modified, such as by forming the first interconnect 109, the second interconnect 111, and the third interconnect 113 within the substrate 101 instead of over the intermediate metallization layers 105.

Figure 2A:
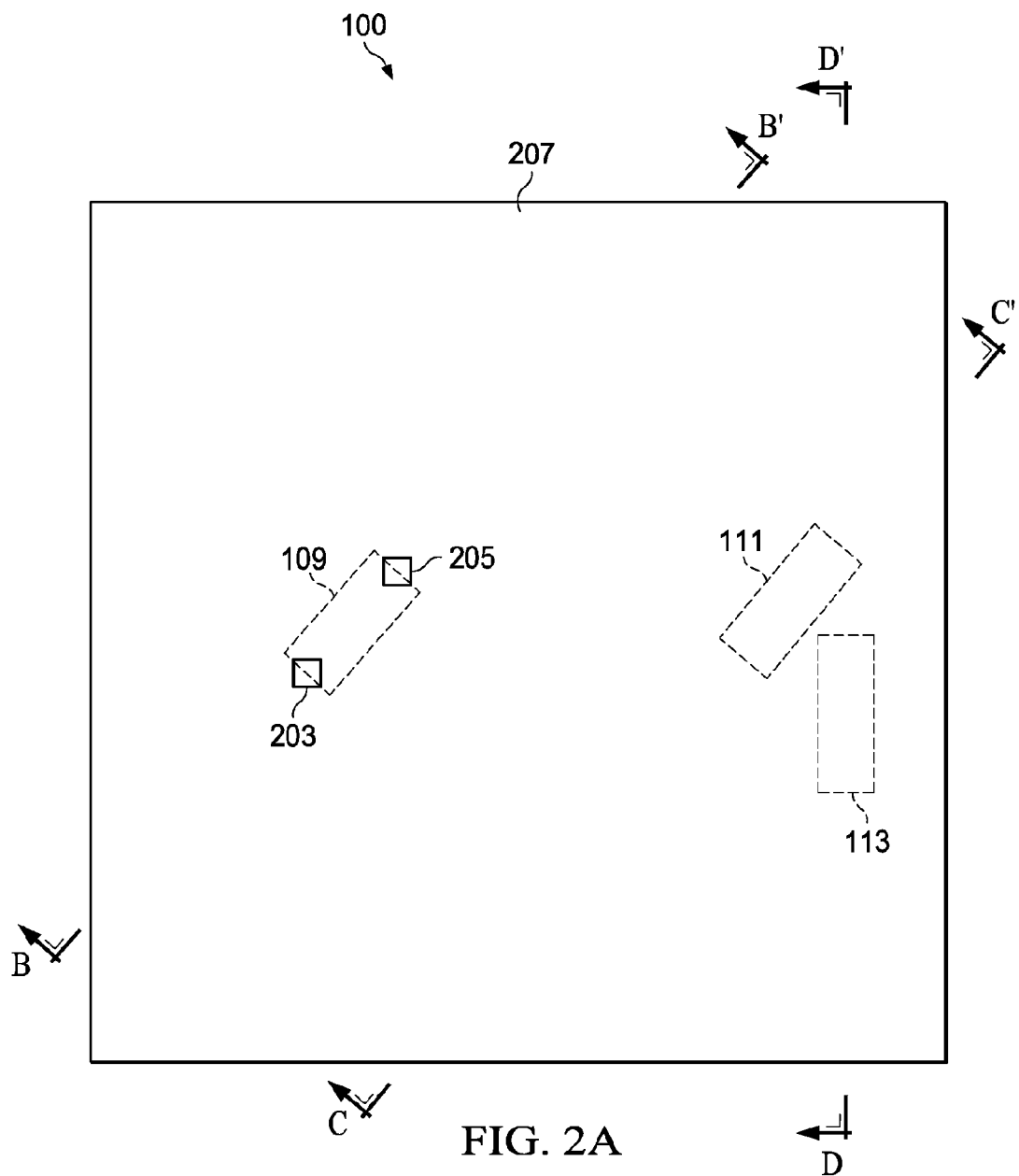
FIGS. 2A-2D illustrate a second mask used to manufacture vias in accordance with an embodiment.
Figure 2B:
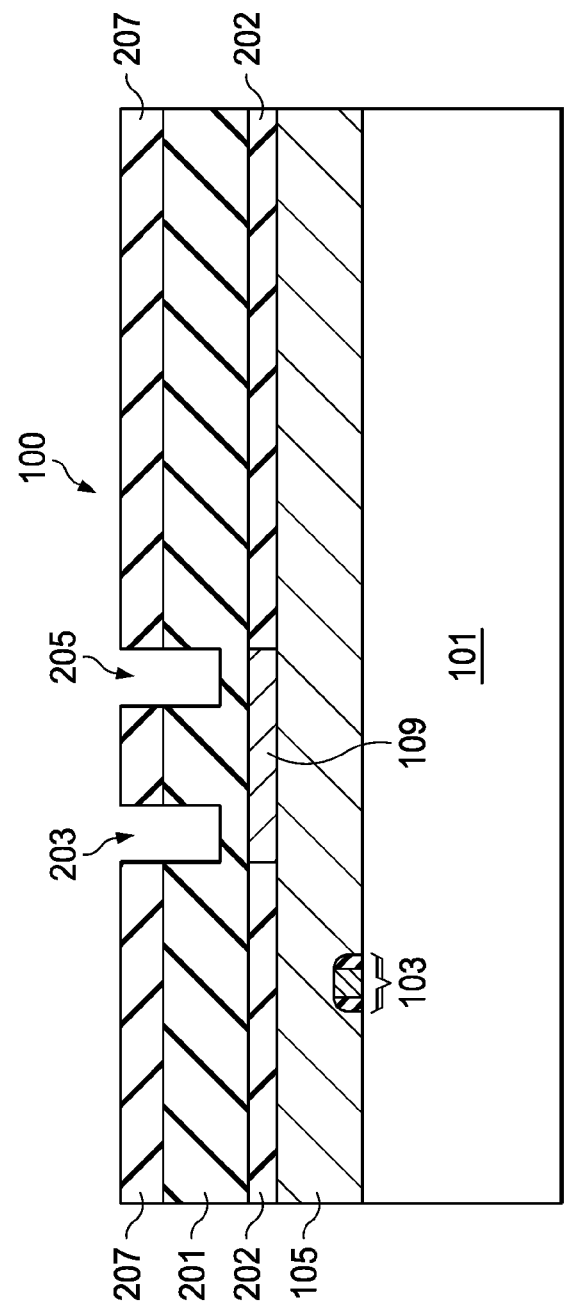
Figure 2C:
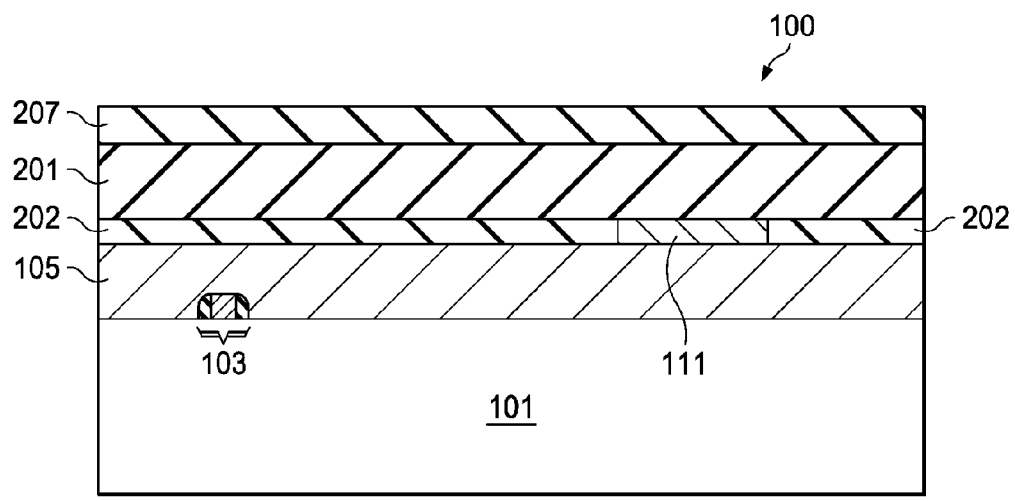
Figure 2D:
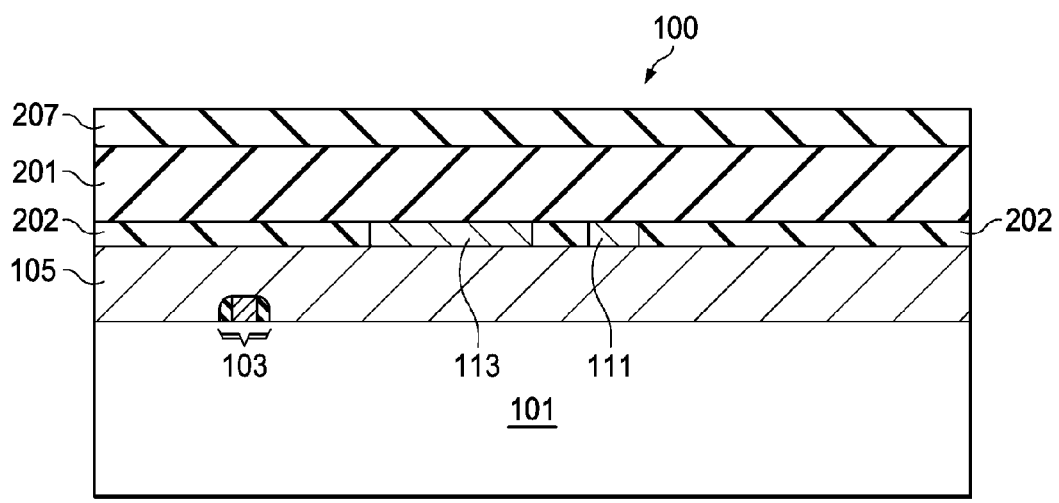

FIGS. 2A-2D illustrate a formation of a first passivation layer 202, and a second passivation layer 201, and also illustrate a start of a formation process for a first via 203 and a second via 205, wherein FIGS. 2B, 2C, and 2D illustrate cross sectional views of FIG. 2A along lines B-B', C-C', and D-D', respectively. The first passivation layer 202 may be initially formed over the first interconnect 109, the second interconnect 111, and the third interconnect 113. The first passivation layer 202 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 202 may be formed through a process such as chemical vapor deposition (CVD), although any suitable process may be utilized, and may have a thickness between about 0.5 µm and about 5 µm, such as about 9.25 KÅ. Once formed, the first passivation layer 202 may be planarized with the first interconnect 109, the second interconnect 111, and the third interconnect 113 using a planarization process such as, e.g., a chemical mechanical polishing process.

However, as one of ordinary skill in the art will recognize, the above described process of forming the first passivation layer 202, the first interconnect 109, the second interconnect 111, and the third interconnect 113 are merely intended to be illustrative and are not intended to limit the embodiments. Any suitable processes or order of process steps, such as forming the first interconnect 109, the second interconnect 111, and the third interconnect 113 using different methods from each other, or forming the first passivation layer 202 prior to forming the first interconnect 109, the second interconnect 111, and the third interconnect 113, may alternatively be utilized. All such methods of formation for the first interconnect 109, the second interconnect 111, and the third interconnect 113 are fully intended to be included within the embodiments.

The second passivation layer 201 may be formed over the first interconnect 109, the second interconnect 111, the third interconnect 113, and the first passivation layer 202. The second passivation layer 201 may be formed from a polymer such as polyimide. Alternatively, the second passivation layer 201 may be formed of a material similar to the material used as the first passivation layer 202, such as silicon oxides, silicon nitrides, low-k dielectrics, extremely low-k dielectrics, combinations of these, and the like. The second passivation layer 201 may be formed to have a thickness between about 2 µm and about 15 µm, such as about 5 µm.

After the second passivation layer 201 has been formed, the first via 203 and the second via 205 may be formed over the first interconnect 109 in order to allow for an eventual physical and electrical contact to the first interconnect 109 through the second passivation layer 201. In an embodiment the first via 203 and the second via 205 are utilized to provide interconnections between a first coil 401 and a second coil 403 of the first inductor 400 (not illustrated in FIGS. 2A-2D but illustrated and discussed further below with respect to FIGS. 4A-4D).

The first via 203 and the second via 205 may be formed, e.g., by first forming openings for the first via 203 and the second via 205 into the second passivation layer 201 using, e.g., a two step process that utilizes two suitable photolithographic masks and etching. In an embodiment the openings for the first via 203 and the second via 205 may be initiated (as illustrated by FIGS. 2A-2D) using a second mask 207 along with an etching process in order to form the shape of a lower portion of the first via 203 and the second via 205 (the shape that will come into contact with the first interconnect 109).

The second mask 207 may be similar to the first mask 115 (discussed above with respect to FIGS. 1A-1D). For example, the second mask 207 may be a photoresist that has been patterned by exposing and developing a layer of photoresist composition (not individually illustrated) into the desired pattern for the first via 203 and the second via 205. However, the second mask 207 may alternatively be a hard mask such as silicon nitride. Any suitable masking material and any process of patterning the masking material may alternatively be utilized.

Once the second mask 207 has been placed and patterned, the pattern of the second mask 207 may be transferred to the second passivation layer 201. In an embodiment a directional etching process may be utilized to remove the material of the second passivation layer 201 while using the second mask 207 as a mask during the etching. As such, only exposed and unprotected material is removed, thereby transferring the pattern of the second mask 207 into the second passivation layer 201.

Once the pattern of the second mask 207 has been transferred to the second passivation layer 201, the second mask 207 may be removed. In an embodiment in which the second mask 207 is a photoresist, the second mask 207 may be removed using, e.g., an ashing process, whereby the temperature of the second mask 207 is increased until a thermal decomposition occurs, whereby the photoresist may be removed. However, any other suitable method of removal, such as an etching process, may alternatively be utilized.

Figure 3A:
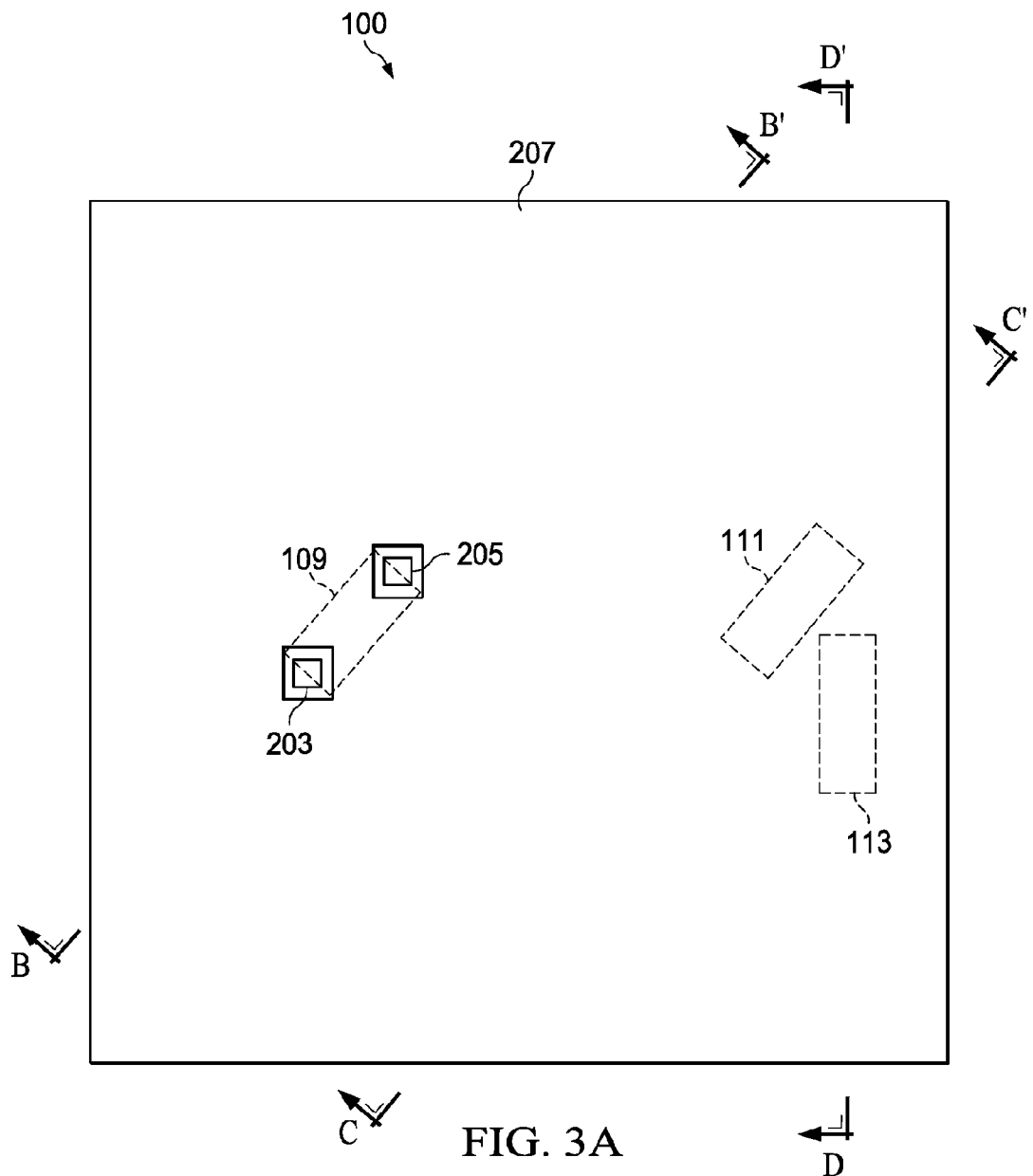
FIGS. 3A-3D illustrate a third mask used to manufacture vias in accordance with an embodiment.
Figure 3B:
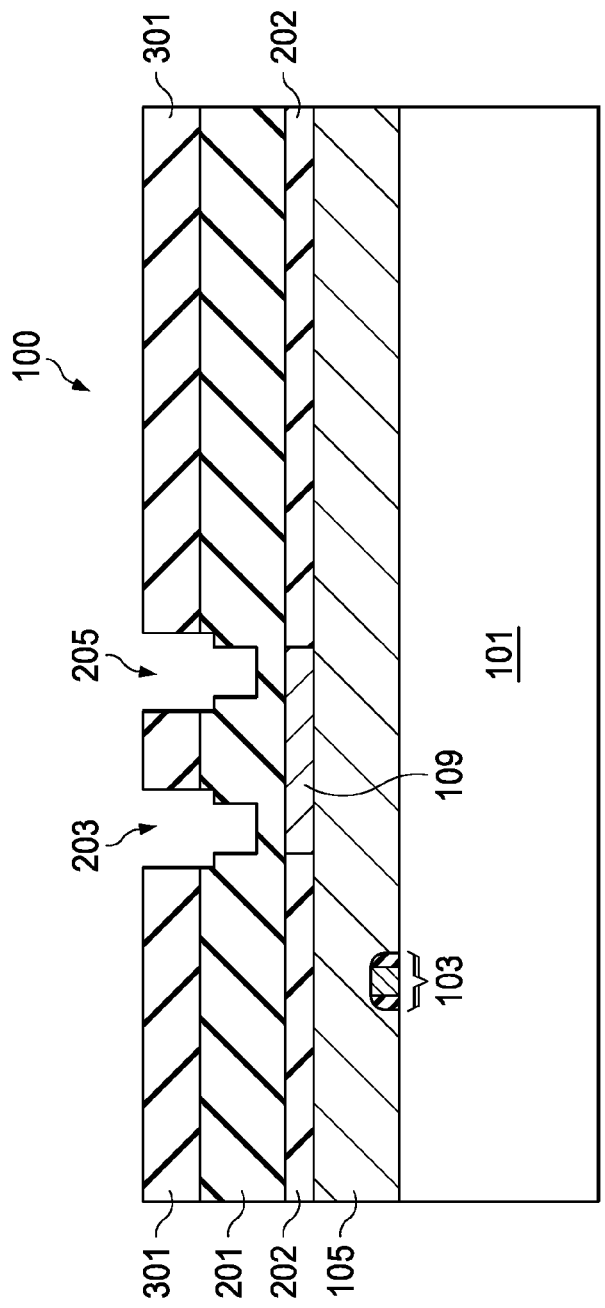
Figure 3C:
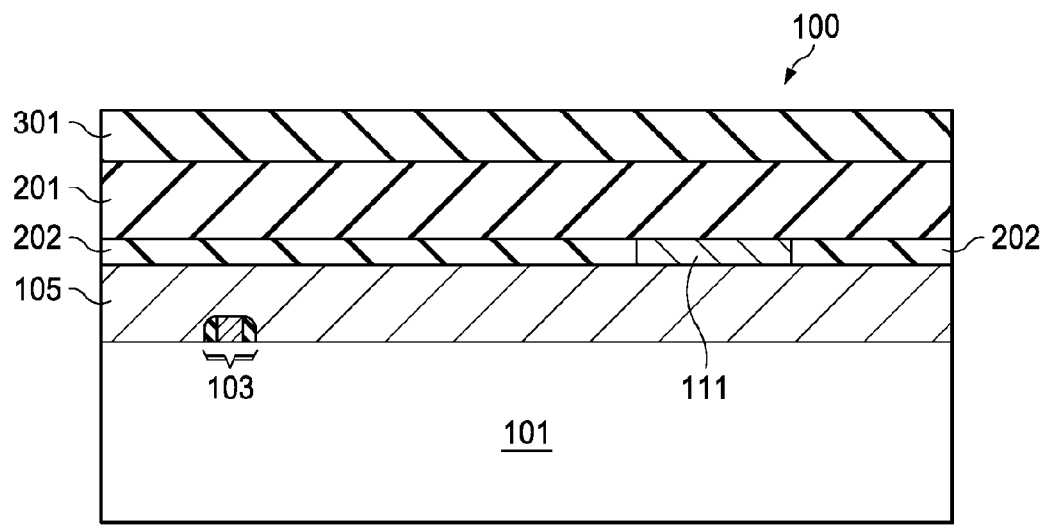
Figure 3D:
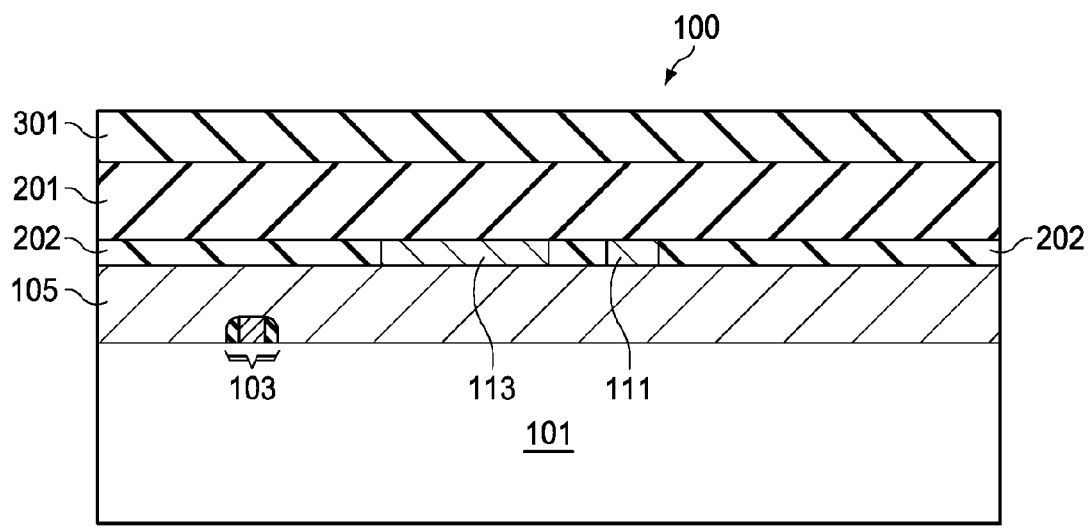

FIGS. 3A-3D illustrate an extension of the lower portions of the first via 203 and the second via 205, wherein FIGS. 3B, 3C, and 3D illustrate cross sectional views of FIG. 3A along lines B-B', C-C', and D-D', respectively. In an embodiment, once the lower portion of the first via 203 and the second via 205 have been shaped by the second mask 207 and etch, a third mask 301 and an etching process may be used to extend the first via 203 and the second via 205 to the first interconnect 109 as well as widen an upper portion of the first via 203 and the second via 205 where the first via 203 and the second via 205 will come into contact with the turns of the first inductor 400.

The third mask 301 may be similar to the first mask 115 (discussed above with respect to FIGS. 1A-1D and the second mask 207 (discussed above with respect to FIGS. 2A-2D). For example, the third mask 301 may be a photoresist that has been patterned by exposing and developing a layer of photoresist composition (not individually illustrated) into the desired pattern for the upper portions of the first via 203 and the second via 205. However, the third mask 301 may alternatively be a hard mask such as silicon nitride. Any suitable masking material and any process of patterning the masking material may alternatively be utilized.

Once the third mask 301 has been placed and patterned, the pattern of the third mask 301 may be transferred to the second passivation layer 201. In an embodiment a directional etching process may be utilized to remove the material of the second passivation layer 201 while using the third mask 301 as a mask during the etching. As such, only exposed and unprotected material is removed, thereby transferring the pattern of the third mask 301 into the second passivation layer 201. This process forms the widened upper portions of the first via 203 and the second via 205, as well as extending the shape of the lower portions of the first via 203 and the second via 205 through the second passivation layer 201 in order to expose the first interconnect 109.

Figure 4A:
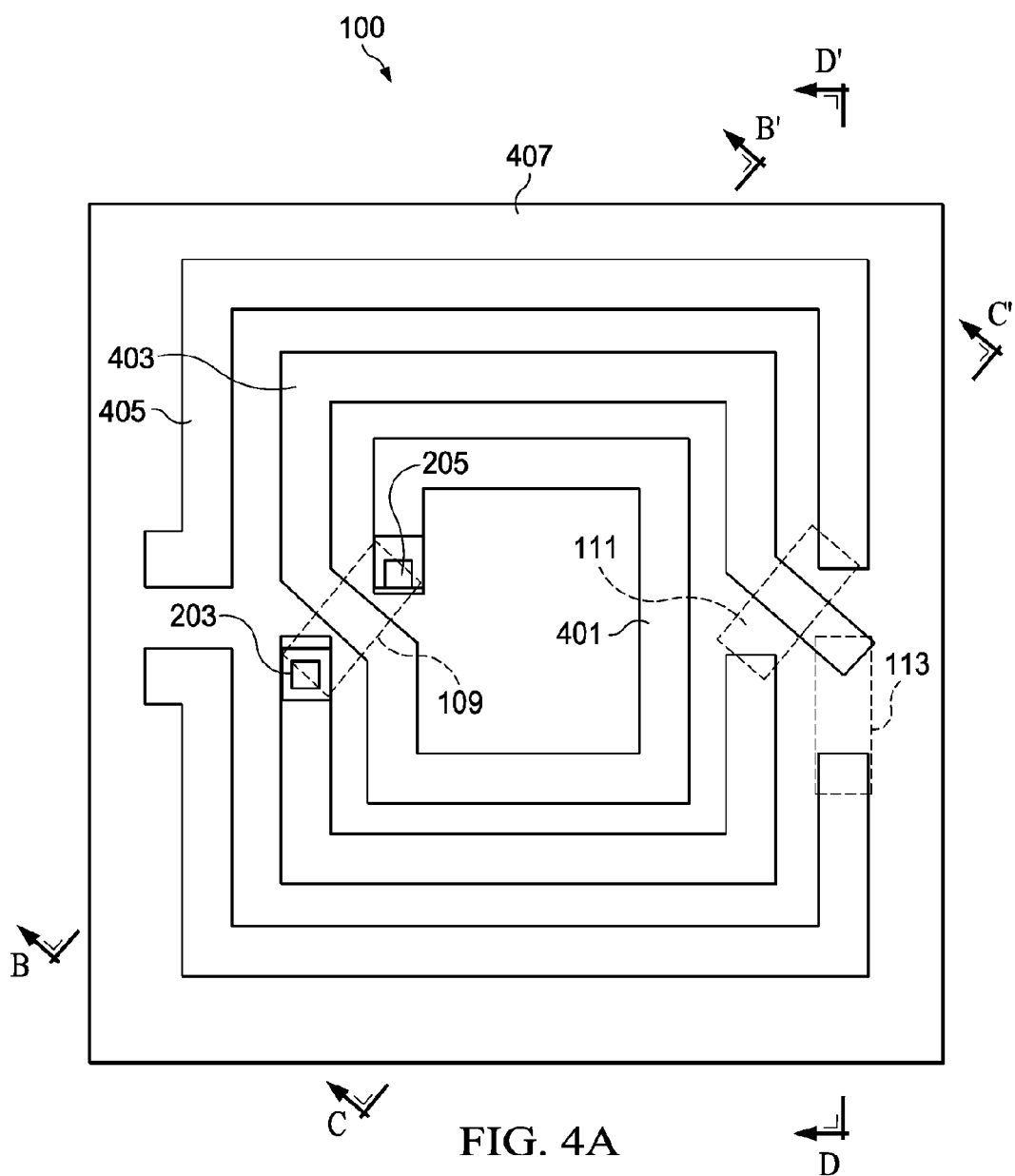
FIGS. 4A-4D illustrate a fourth mask used to manufacture coils in accordance with an embodiment.
Figure 4B:
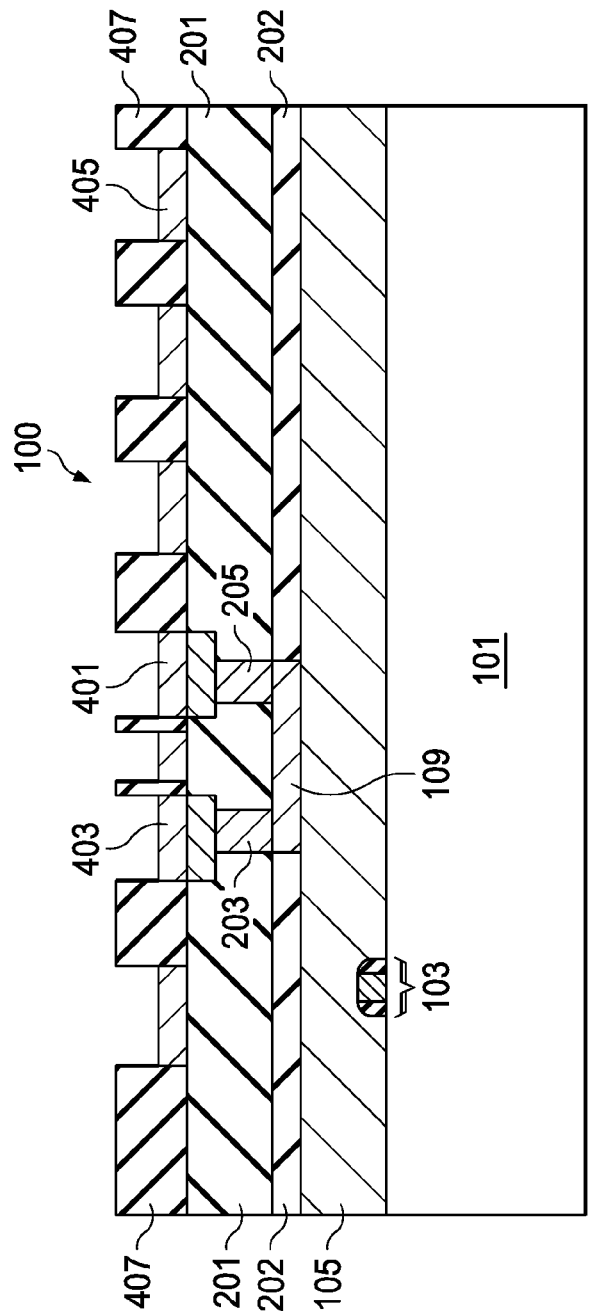
Figure 4C:
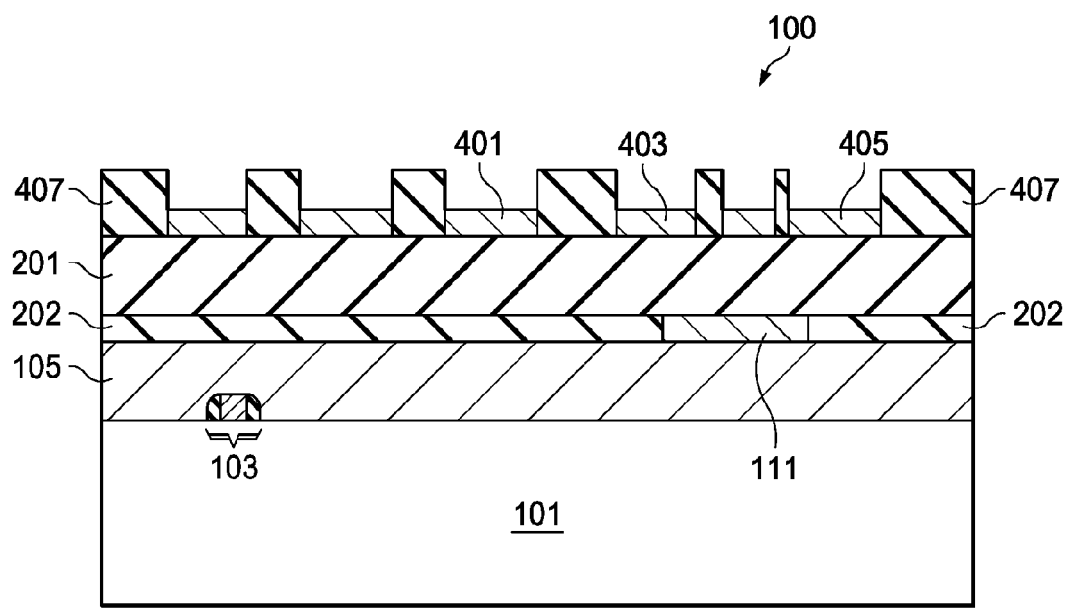
Figure 4D:
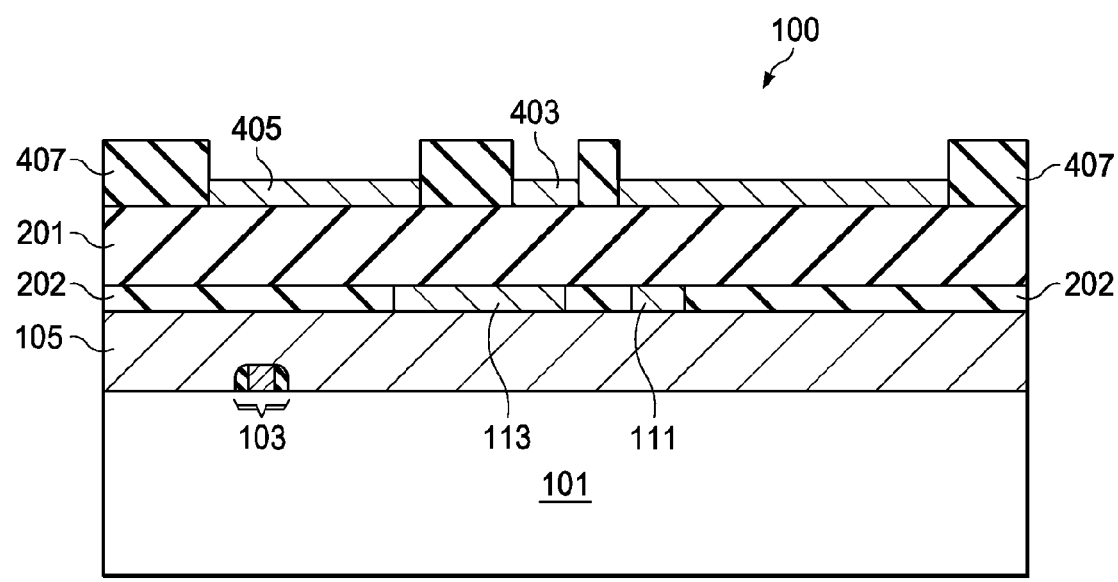

FIG. 4A-4D illustrate a removal of the third mask 301 along with a filling of the openings to form the first via 203 and the second via 205, wherein FIGS. 4B, 4C, and 4D illustrate cross sectional views of FIG. 4A along lines B-B', C-C', and D-D', respectively. In an embodiment in which the third mask 301 is a photoresist, the third mask 301 may be removed using, e.g., an ashing process, whereby the material of the third mask 301 is increased until the material of the third mask 301 thermally decomposes and may be removed. However, any suitable removal process, such as etching or applying a suitable solvent, may alternatively be utilized.

After the third mask 301 has been removed, the first via 203 and the second via 205 may be formed using a first seed layer (not shown) and a plating process, such as electrochemical plating, although other processes of formation, such as sputtering, evaporation, or PECVD process, may alternatively be used depending upon the desired materials. The first via 203 and the second via 205 may comprise copper, but other materials, such as aluminum or tungsten, may alternatively be used. Once the openings for the first via 203 and the second via 205 have been filled with conductive material, any excess conductive material outside of the openings for the first via 203 and the second via 205 may be removed, and the first via 203, the second via 205 and the second passivation layer 201 may be planarized using, for example, a chemical mechanical polishing process.

FIGS. 4A-4D additionally illustrate the formation of a first coil 401 and a second coil 403 in connection with the first interconnect 109 through the first via 203 and the second via 205 to form the first inductor 400, along with a third coil 405 unconnected to the second interconnect 111, the third interconnect 113, the first coil 401 and the second coil 403. In an embodiment the first inductor 400 may be a series of conductive coils, such as the first coil 401 and the second coil 403, in a plane substantially parallel to the semiconductor substrate 101. The first coil 401 and the second coil 403 may comprise a conductive material such as copper, although other materials, such as aluminum, may alternatively be used. In an embodiment, the conductive material for the first coil 401 and the second coil 403 may be formed by first applying a second seed layer (not shown) over the second passivation layer 201.

Once the second seed layer has been placed a fourth mask 407 may be formed over the second passivation layer 201 and the second seed layer. In an embodiment the fourth mask 407 may be similar to the first mask 115 (discussed above with respect to FIGS. 1A-1D), the second mask 207 (discussed above with respect to FIGS. 2A-2D), and the third mask 301 (discussed above with respect to FIGS. 3A-3D). For example, the fourth mask 407 may be a photoresist material that has been patterned by exposing and developing a layer of photoresist material (not individually illustrated) into the desired pattern for the first coil 401, the second coil 403, and the third coil 405. However, the fourth mask 407 may alternatively be a hard mask such as silicon nitride. Any suitable masking material and any process of patterning the masking material may alternatively be utilized.

Once the fourth mask 407 is in place, the second seed layer may then be utilized, for example, in an electroplating process in order to plate the conductive material over the second seed layer, thereby forming the first coil 401, the second coil 403, and the third coil 405 on the second passivation layer 201 within the fourth mask 407. Once formed, the fourth mask 407 and undesired portions of the seed layer (e.g., those portions of the seed layer that were covered by the photoresist) may be removed.

Once the first coil 401, the second coil 403, and the third coil 405 have been formed, a third passivation layer (not individually illustrated in order to better illustrate the coils) may be formed to provide protection to the first coil 401, the second coil 403, and the third coil 405. In an embodiment the third passivation layer may be similar to the second passivation layer 201, such as being a polymer such as polyimide formed to a thickness of between about 2 μm and about 15 µm, such as about 5 µm. However, any other suitable material may alternatively be utilized.

In the manufacturing process for the structure illustrated in FIGS. 1A-4D, a number of photolithographic masks are used to pattern the various layers that have been deposited or otherwise placed on the semiconductor substrate 101. In the particular embodiment illustrated, four masks are utilized to pattern the various materials, such as the first mask 115 to pattern the first interconnect 109, the second interconnect 111, and the third interconnect 113; the second mask 207 and the third mask 301 utilized to pattern the second passivation layer 201 and shape the first via 203 and the second via 205; and the fourth mask 407 used to form the first coil 401, the second coil 403, and the third coil 405. As such, in this embodiment four masks are used to form the first inductor 400. As such, for this embodiment, the first inductor 400 is physically manufactured to have two turns using the manufacturing of the first via 203 and the second via 205 to connect the first coil 401 to the second coil 403. In particular, the first inductor 400 is manufactured to have two turns by not forming additional vias in connection with the second interconnect 111 and the third interconnect 113. Such a lack of connections separates the various coils (as illustrated in FIG. 4A), allowing two turns to be utilized by the first inductor 400.

In this embodiment the third coil 405 is disconnected from the first coil 401 and the second coil 403 and, as such, is not a functional part of the first inductor 400, thereby keeping the first inductor 400 as a two turn inductor even though the third coil 405 is still present physically and manufactured in the manufacturing process. As such, the third coil 405 may be used as a guard ring to provide additional protection to the first coil 401 and the second coil 403 of the first inductor 400. Alternatively, the third coil 405 may be electrically connected to the intermediate metallization layers 105 (which connection is not illustrated) and used as an additional path for routing signals, power and group around the semiconductor die 100.

Figure 5A:
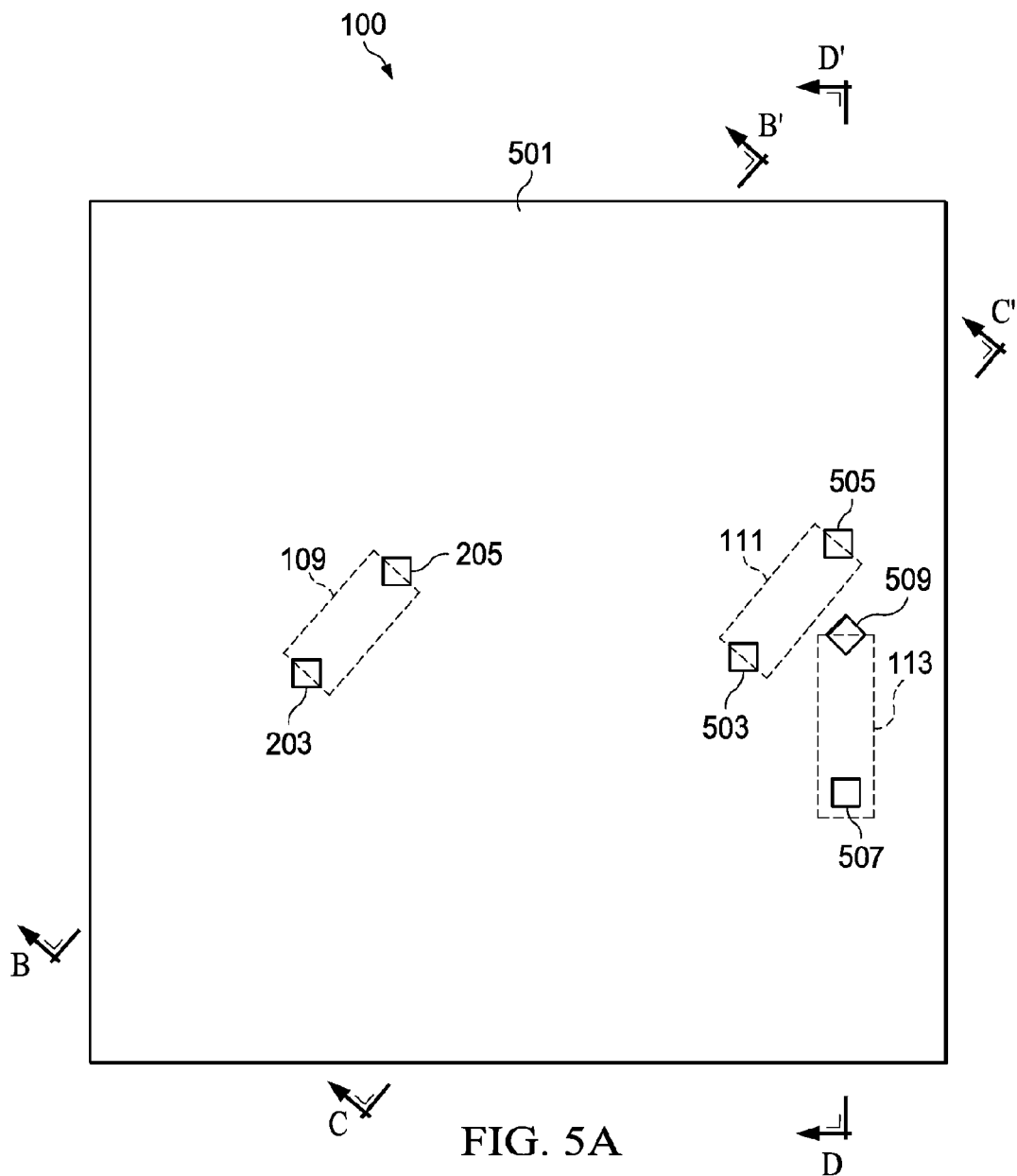
FIGS. 5A-5D illustrate a fifth mask used to manufacture vias in accordance with an embodiment.
Figure 5B:
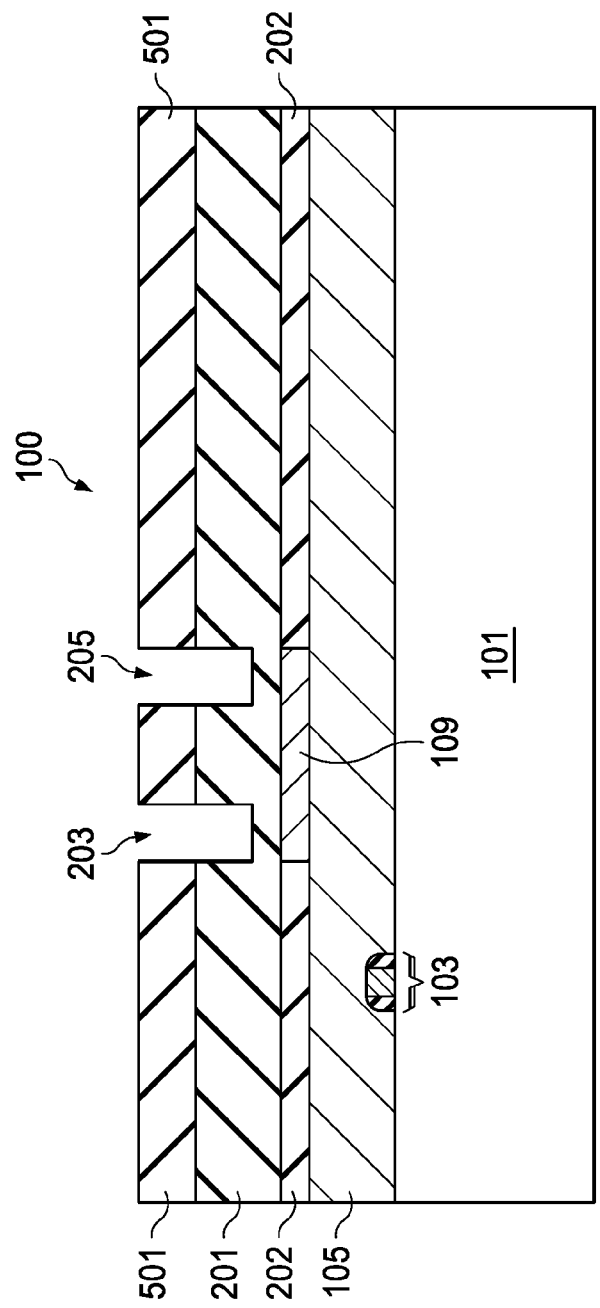
Figure 5C:
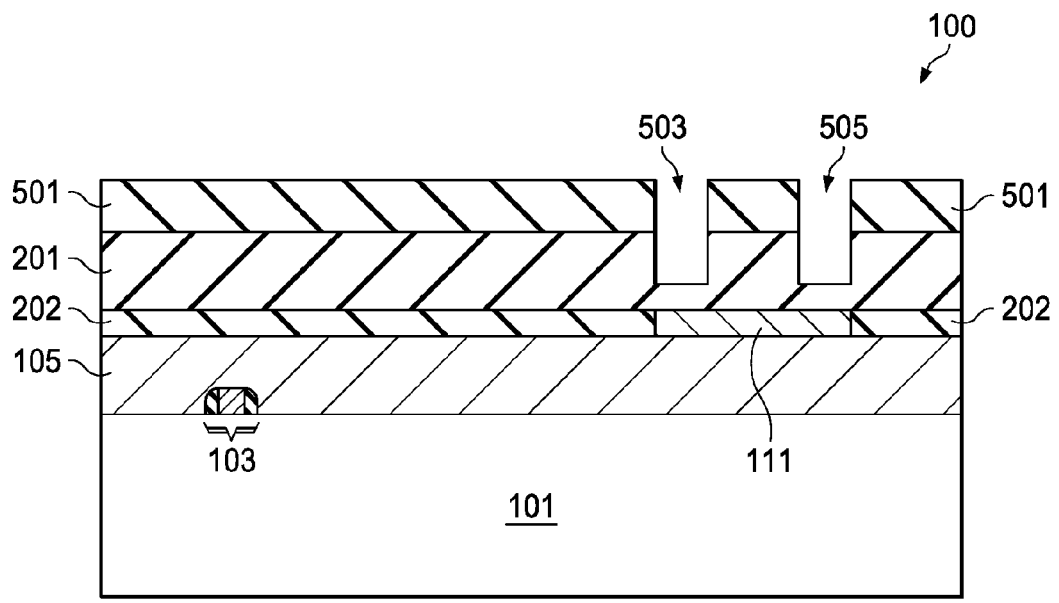
Figure 5D:
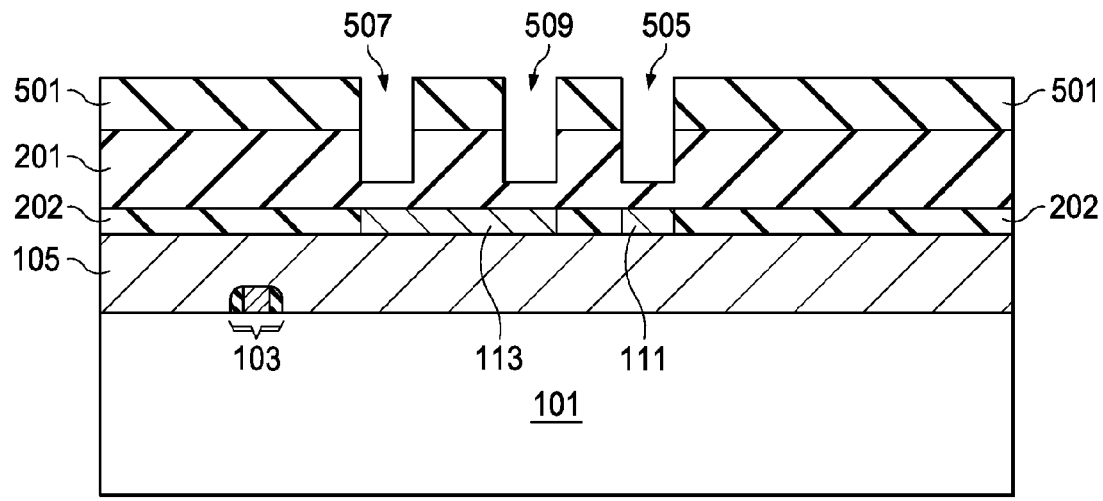

FIGS. 5A-5D illustrate a formation of a second inductor 700 (not illustrated in FIGS. 5A-5D but illustrated and discussed in greater detail below with respect to FIGS. 7A-7D) that has three turns instead of the two turns illustrated above with respect to FIGS. 1A-4D, wherein FIGS. 5B, 5C, and 5D illustrate cross sectional views of FIG. 5A along lines B-B', C-C', and D-D', respectively. In this embodiment the first via 203 and the second via 205 are still formed to provide electrical connection to the first interconnect 109. Additionally in this embodiment, however, a third via 503 and a fourth via 505 are formed to connect to the second interconnect 111 and a fifth via 507 and a sixth via 509 are formed to connect to the third interconnect 113.

In order to form the third via 503, the fourth via 505, the fifth via 507, and the sixth via 509, the second mask 207 and the third mask 301 (discussed above with respect to FIGS. 2A-2D and 3A-3D, respectively) are replaced with a fifth mask 501, which is illustrated in FIGS. 5A-5D. In an embodiment the fifth mask 501 may be similar to the first mask 115 (discussed above with respect to FIGS. 1A-1D), the second mask 207 (discussed above with respect to FIGS. 2A-2D), the third mask 301 (discussed above with respect to FIGS. 3A-3D), and the fourth mask 407 (discussed above with respect to FIGS. 4A-4D). For example, the fifth mask 501 may be a photoresist material that has been patterned by exposing and developing a layer of photoresist composition (not individually illustrated) into the desired pattern for the upper portions of the first via 203 and the second via 205. However, the fifth mask 501 may alternatively be a hard mask such as silicon nitride. Any suitable masking material and any process of patterning the masking material may alternatively be utilized.

However, in addition to being patterned into the desired pattern to form the upper portions of the first via 203 and the second via 205, the fifth mask 501 is also patterned to form upper portions of the third via 503 and the fourth via 505 (as illustrated in FIG. 5C), and also into the desired pattern for the upper portions of the fifth via 507 and the sixth via 509 (as illustrated in FIG. 5D). Once patterned, the same removal process (e.g., etching) may be utilized to form the upper portions of the first via 203, the second via 205, the third via 503, the fourth via 505, the fifth via 507, and the sixth via 509 at the same time, with all of them using the fifth mask 501 as a mask to protect the remainder of the second passivation layer 201.

Figure 6A:
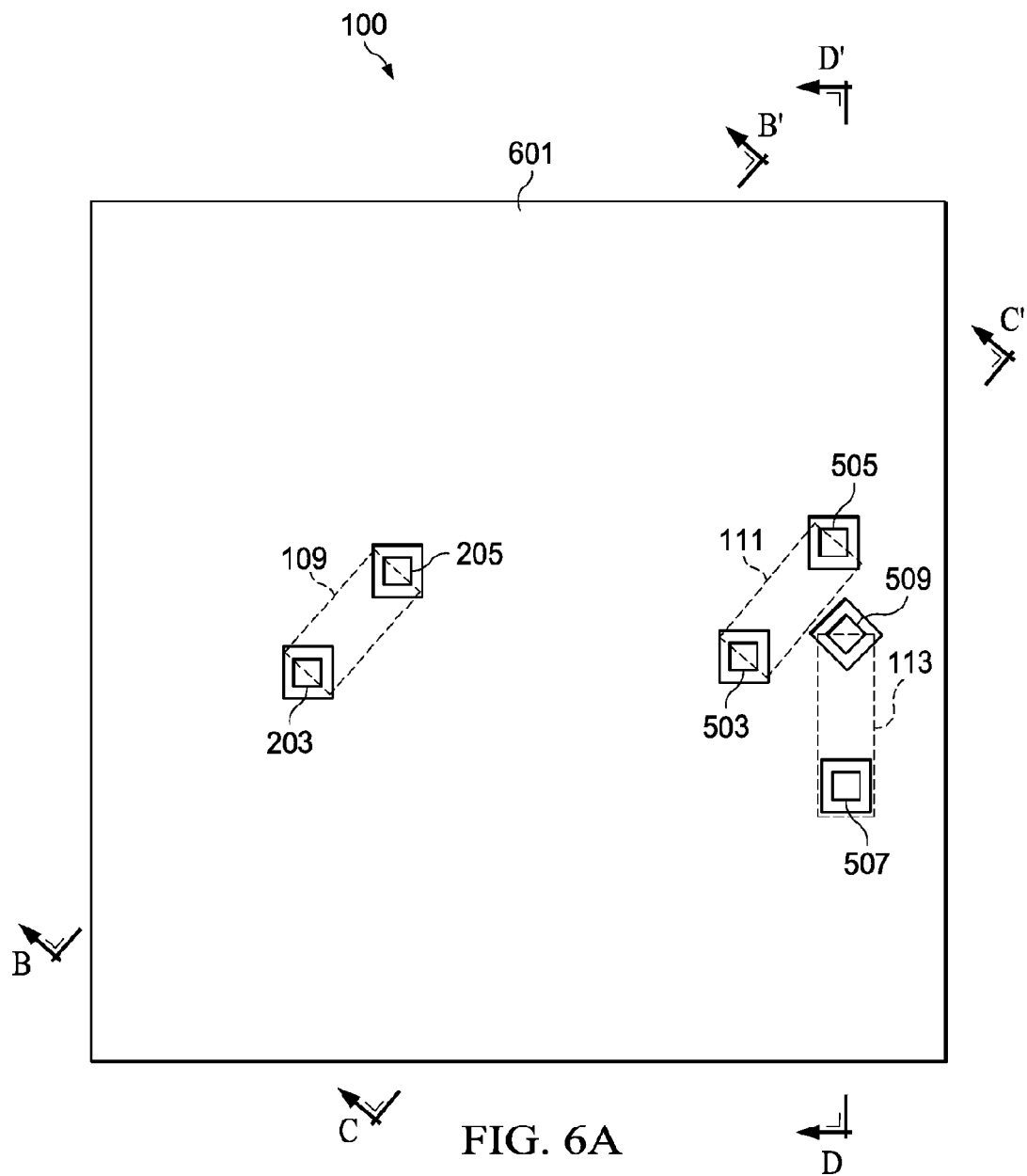
FIGS. 6A-6D illustrate a sixth mask used to manufacture vias in accordance with an embodiment.
Figure 6B:
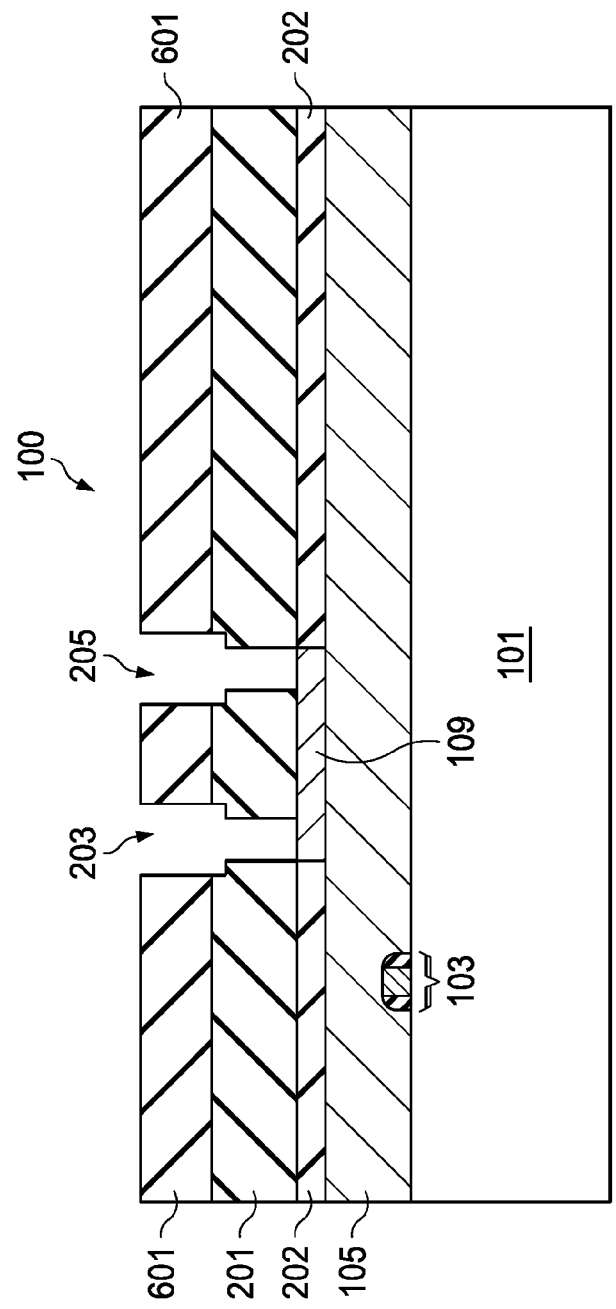
Figure 6C:
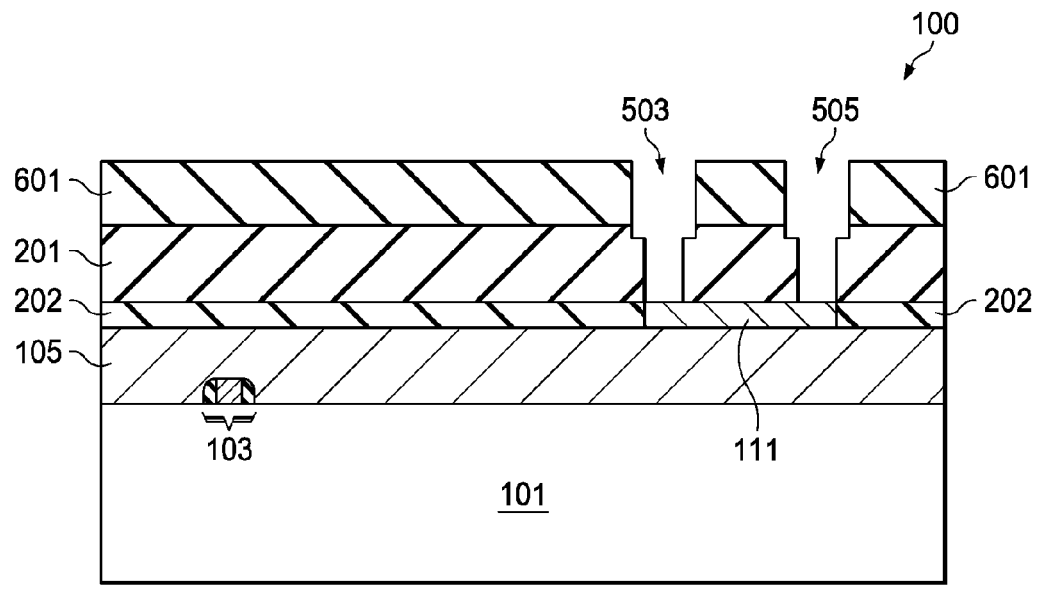
Figure 6D:
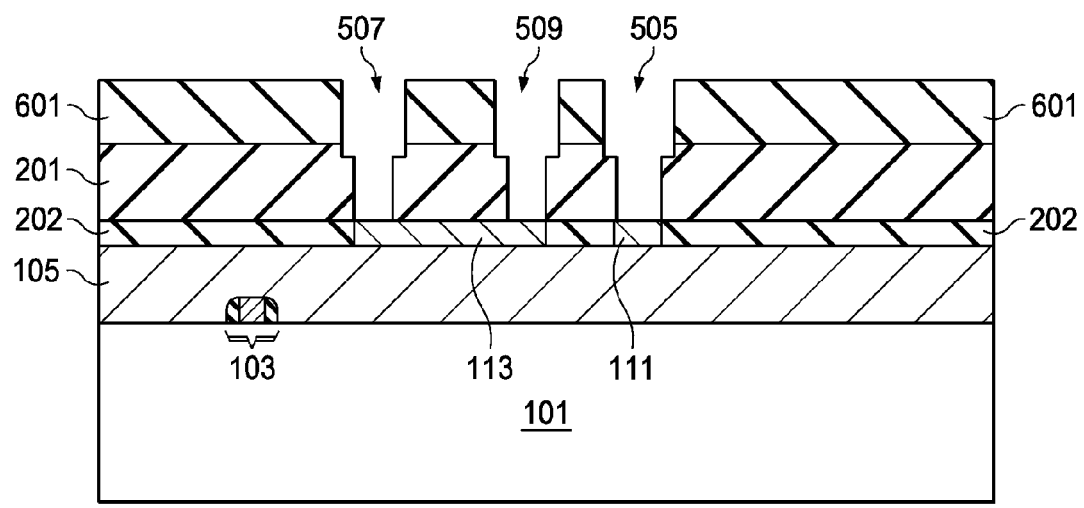

FIGS. 6A-6D illustrate an extension of the first via 203, the second via 205, the third via 503, the fourth via 505, the fifth via 507, and the sixth via 509 using a sixth mask 601, wherein FIGS. 6B, 6C, and 6D illustrate cross sectional views of FIG. 6A along lines B-B', C-C', and D-D', respectively. In an embodiment the sixth mask 601 may be similar to the first mask 115 (discussed above with respect to FIGS. 1A-1D), the second mask 207 (discussed above with respect to FIGS. 2A-2D), the third mask 301 (discussed above with respect to FIGS. 3A-3D), the fourth mask 407 (discussed above with respect to FIGS. 4A-4D), and the fifth mask 501 (discussed above with respect to FIGS. 5A-5D). For example, the sixth mask 601 may be a photoresist material that has been patterned by exposing and developing a layer of photoresist composition (not individually illustrated) into the desired pattern for the upper portions of the first via 203, the second via 205, the third via 503, the fourth via 505, the fifth via 507, and the sixth via 509. However, the sixth mask 601 may alternatively be a hard mask such as silicon nitride. Any suitable masking material and any process of patterning the masking material may alternatively be utilized.

Once the sixth mask 601 has been placed and patterned, the pattern of the sixth mask 601 may be transferred to the second passivation layer 201. In an embodiment a directional etching process may be utilized to remove the material of the second passivation layer 201 while using the sixth mask 601 as a mask during the etching. As such, only exposed and unprotected material is removed, thereby transferring the pattern of the sixth mask 601 into the second passivation layer 201. This process forms the widened upper portions of the first via 203, the second via 205, the third via 503, the fourth via 505, the fifth via 507, and the sixth via 509. Additionally, the process will also extend the shape of the lower portions of the first via 203, the second via 205, the third via 503, the fourth via 505, the fifth via 507, and the sixth via 509 through the second passivation layer 201 in order to expose the first interconnect 109, the second interconnect 111, and the third interconnect 113.

Figure 7A:
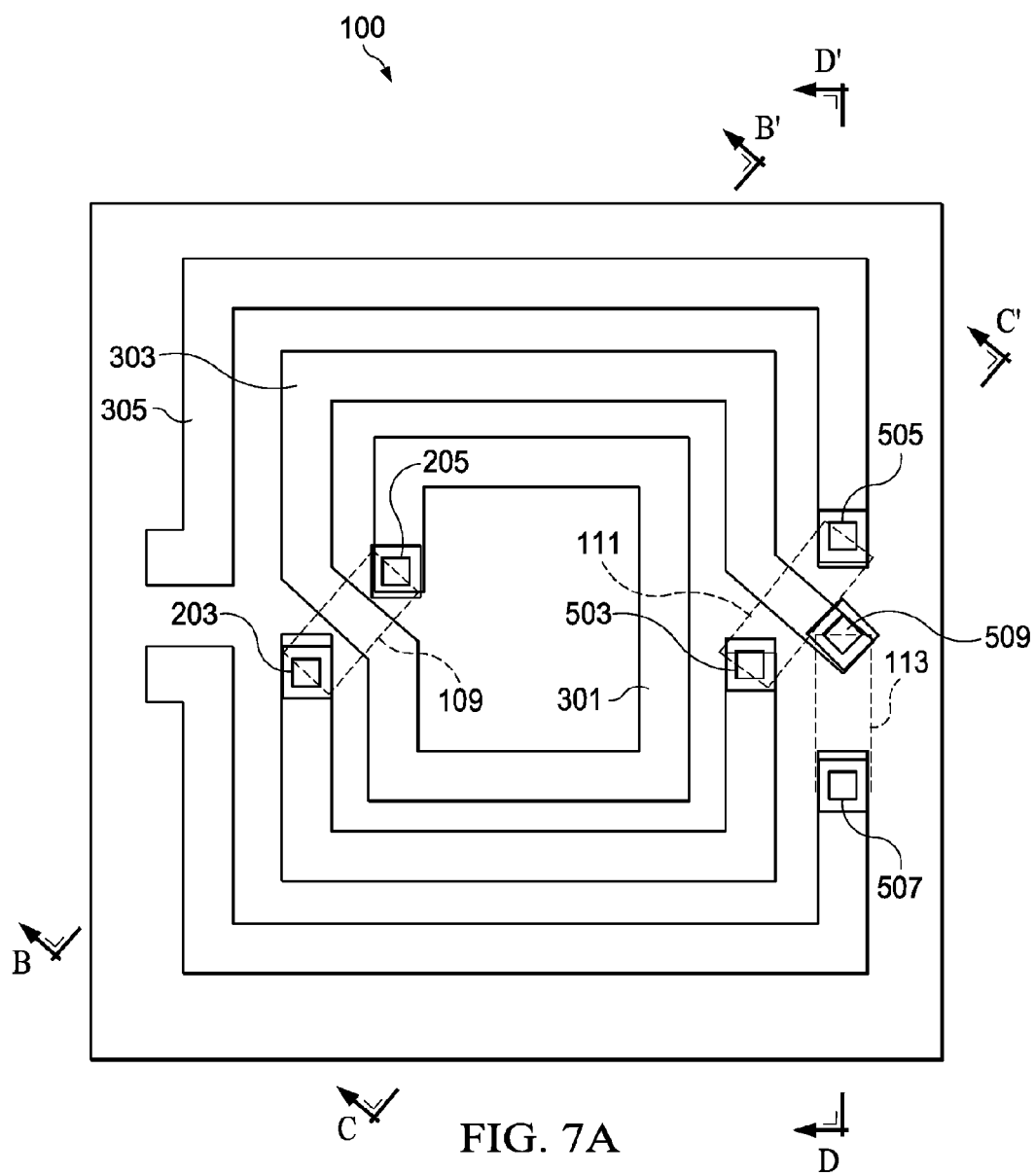
FIGS. 7A-7D illustrate using the fourth mask with the fifth mask and the sixth mask in accordance with an embodiment.
Figure 7B:
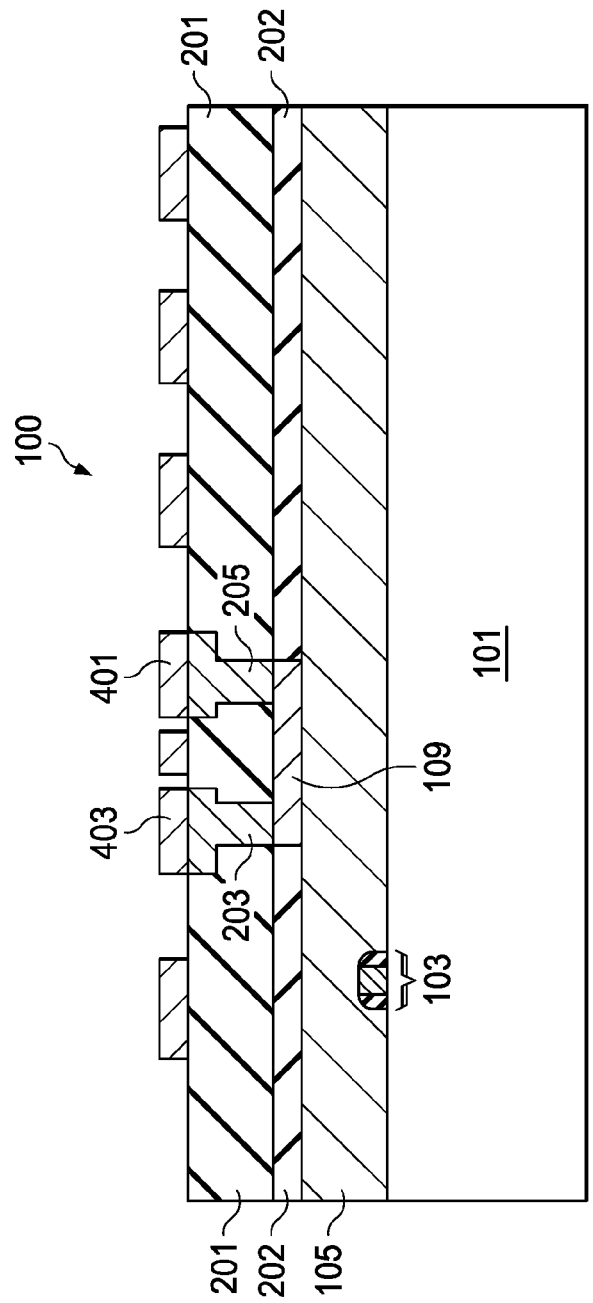
Figure 7C:
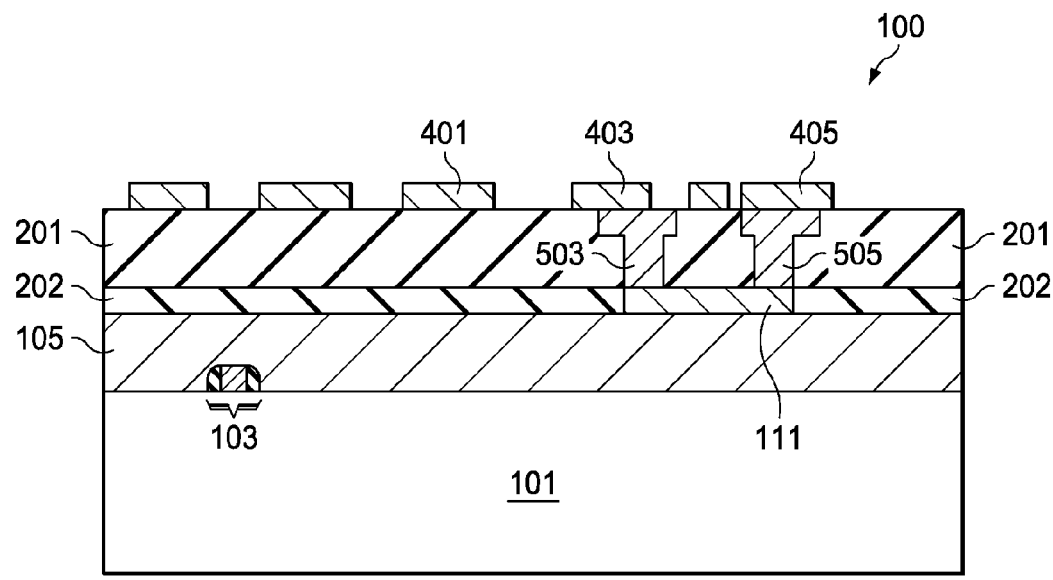
Figure 7D:
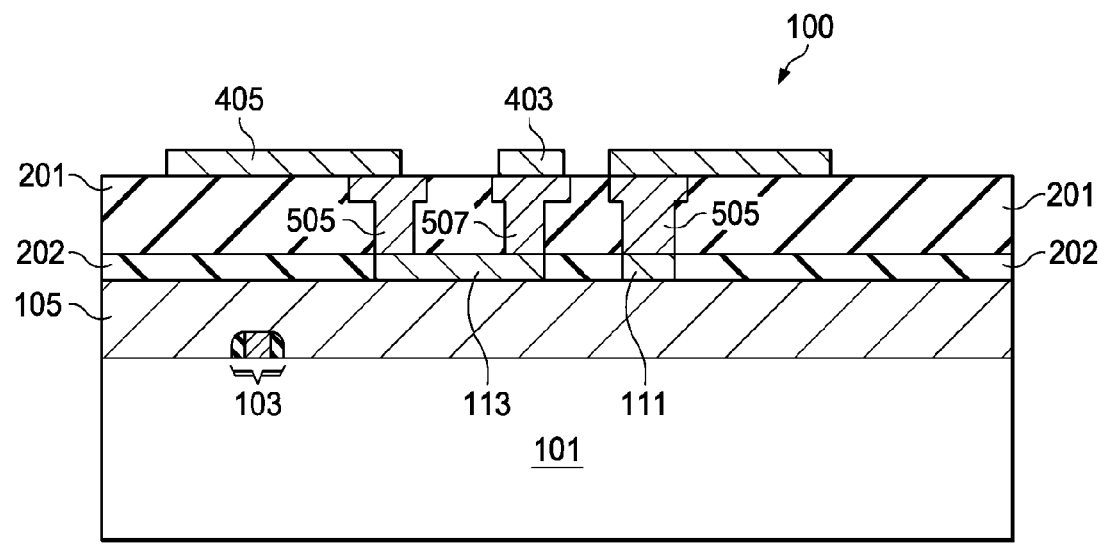

FIGS. 7A-7D illustrate a removal of the sixth mask 601 along with the formation of the first coil 401, the second coil 403, and the third coil 405, wherein FIGS. 7B, 7C, and 7D illustrate cross sectional views of FIG. 7A along lines B-B', C-C', and D-D', respectively. In an embodiment in which the sixth mask 601 is a photoresist, the sixth mask 601 may be removed using, e.g., an ashing process, whereby the material of the sixth mask 601 is increased until the material of the sixth mask 601 thermally decomposes and may be removed. However, any suitable removal process, such as etching or applying a suitable solvent, may alternatively be utilized.

Once the sixth mask 601 has been removed, the first coil 401, the second coil 403, and the third coil 405 may be formed as described above with respect to FIGS. 5A-5D. For example, in an embodiment a seed layer (not individually illustrated) may be initially deposited on the second passivation layer 201, the fourth mask 407 may be applied, and an electroplating process may be utilized to form the first coil 401, the second coil 403, and the third coil 405 on the seed layer. Once formed, the fourth mask 407 may be removed (e.g., by an ashing process), and those portions of the seed layer that were covered by the fourth mask 407 may be removed.

However, with the formation of the third via 503, the fourth via 505, the fifth via 507, and the sixth via 509, the third coil 405, instead of being separated from the first coil 401 and the second coil 403, is not operationally connected to the first coil 401 and the second coil 403 through the second interconnect 111 and the third interconnect 113. As such, the second inductor 700 may be manufactured to have a three turn configuration (as illustrated in FIGS. 7A-7D) instead of the two turn configuration (plus a guard ring) as illustrated in FIGS. 1A-4D.

Additionally, the embodiments discussed herein allow for the second inductor 700 to be manufactured using redundant masks from the design of the first inductor 400. In particular, the second inductor 700 may be manufactured reusing the first mask 115 (used in the manufacturing of the first interconnect 109, the second interconnect 111, and the third interconnect 113) and the fourth mask 407 (used in the manufacturing of the first coil 401, the second coil 403, and the third coil 405). Only the masks utilized for the vias (e.g., the first via 203, the second via 205, the third via 503, the fourth via 505, the fifth via 507, and the sixth via 508) need to be re-designed and replaced between the manufacturing of the first inductor 400 and the second inductor 700. By reducing the number of masks needed, the time and resources of an additional new tape out (NTO) may be reduced, significantly reducing the resources necessary to develop the additional masks and making the overall design and manufacturing process more efficient. In this particular embodiment, a reduction from designing eight masks (four for the first inductor 400 and four for the second inductor 700) to only six masks (four for the first inductor 400 and only two for the second inductor 700) provides about a 30% savings on the costs of designing the masks.

Such a reduction in resources and development between the first inductor 400 and the second inductor 700 becomes much more critical in the manufacture of inductors for wireless communication. In particular, the particular frequencies used in one geographic region (such as a country) may be vastly different from the frequencies used in another geographic region. As such, different inductors are needed in the design of a mobile device that will be used in one region versus another region. For a large manufacturer of semiconductor devices that desires to make devices for all regions, the ability to redundantly reuse at least some of the masks between designs allows the manufacturer more efficiently make devices for each region.

Figure 8A:
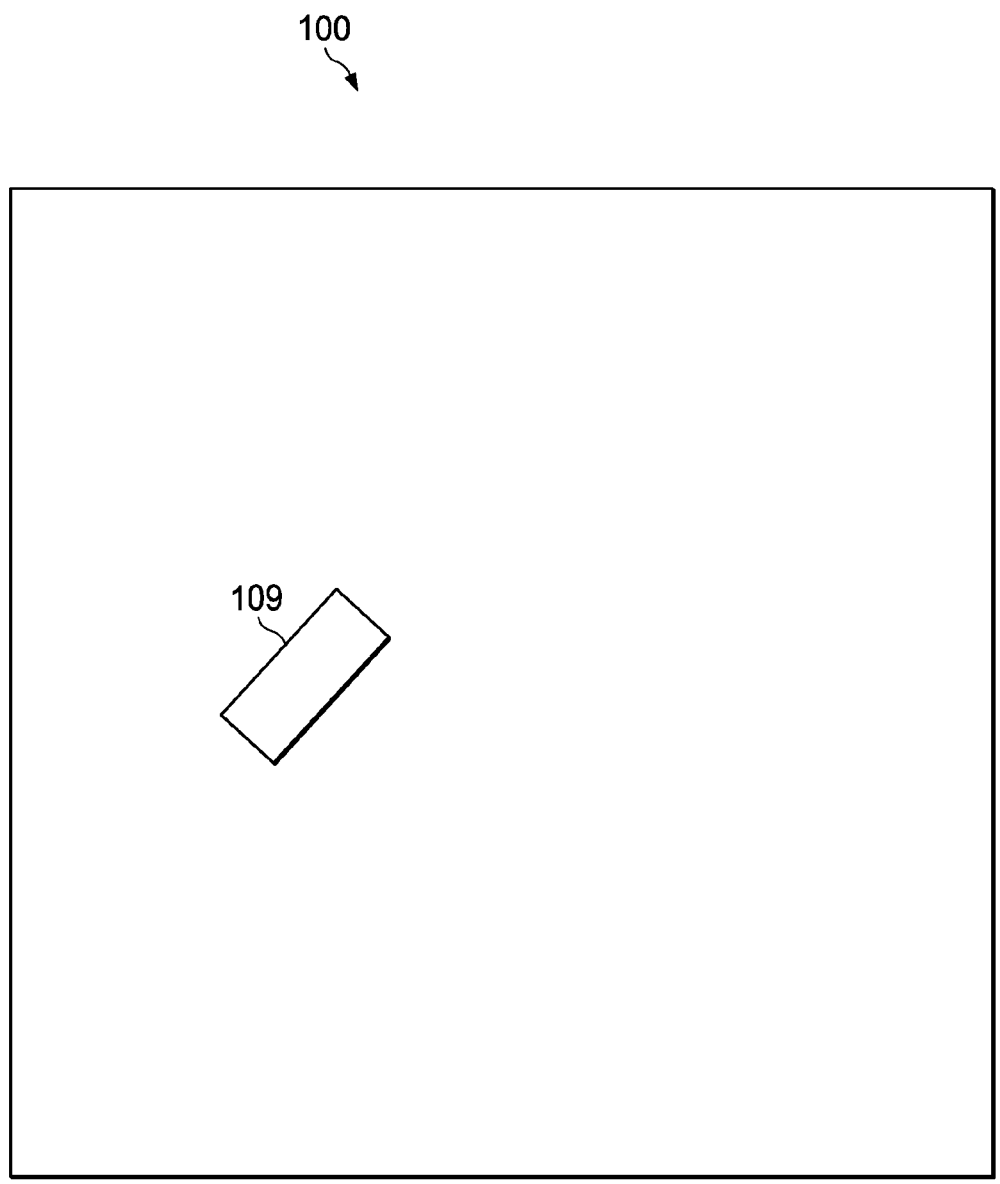
FIGS. 8A-8B illustrate using a seventh mask used to manufacture interconnects in accordance with an embodiment.
Figure 8B:
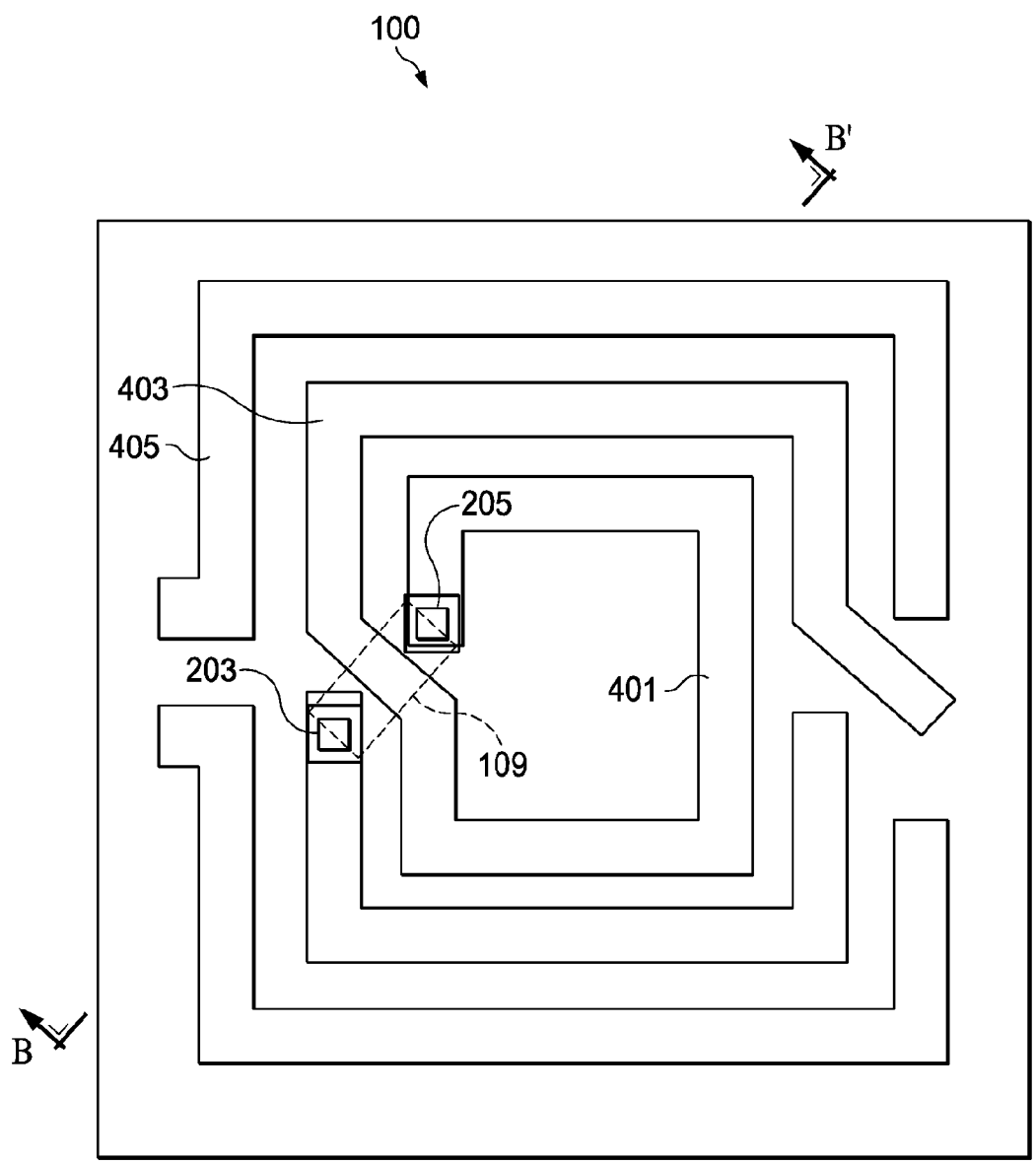

FIG. 8A-8B illustrates another embodiment in which the only mask reused between the first inductor 400 and the second inductor 700 is the fourth mask 407 (used in the manufacture of the first coil 401, the second coil 403, and the third coil 405). In this embodiment the first mask 115 (which was originally used to manufacture the first interconnect 109 along with the second interconnect 111 and the third interconnect 113) is replaced with a seventh mask 801, which is used to form only the first interconnect 109. As such, the second interconnect 111 and the third interconnect 113 are not manufactured during the formation of the first inductor 400 which has only two turns in it.

In this embodiment, when the second inductor 700 is desired to be manufactured, the fourth mask 407 may be reused while the first mask 115, the second mask 207, and the third mask 301 are replaced with, e.g., the seventh mask 801, the fifth mask 501, and the sixth mask 601, respectively. As such, the overall cost of development of the new masks may still be reduced by 12.5%.

In accordance with an embodiment, a method of manufacturing semiconductor devices comprising manufacturing a first inductor using a first mask and a second mask is provided. A second inductor is manufactured using the first mask and a third mask but not the second mask.

In accordance with another embodiment, a method of manufacturing semiconductor devices comprising manufacturing a first inductor is provided. The manufacturing the first inductor further comprises manufacturing a first coil and a second coil, and manufacturing a guard ring around the first coil and the second coil, wherein the guard ring is isolated from the first coil and the second coil, wherein the first coil, the second coil, and the guard ring are in a first pattern. A second inductor is manufactured, wherein the manufacturing the second inductor further comprises manufacturing a third coil, a fourth coil and a fifth coil, wherein the third coil, the fourth coil, and the fifth coil are in the first pattern.

In accordance with yet another embodiment, an inductor comprising a first coil and a second coil in a first layer and a guard ring around the first coil and the second coil in the first layer. A first interconnect connects the first coil and the second coil in a second layer, and a second interconnect is in the second layer, the second interconnect extending below both the second coil and the guard ring, but being electrically isolated from the second coil and the guard ring.

Although the embodiments and their advantages have been described in detail, it should be understood that various changes, substitutions and alterations can be made herein without departing from the spirit and scope of the embodiments as defined by the appended claims. For example, the sizes and shapes of the interconnects may be changed as well as the overall size of the inductor may be changed.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
two or more concentric coils located within a coil layer over a semiconductor substrate;
a plurality of conductive interconnects located within an interconnect layer, the interconnect layer being located between the coil layer and the semiconductor substrate, each of the plurality of conductive interconnects extending under at least two of the two or more concentric coils and at least one of the plurality of conductive interconnects being electrically isolated; and a first set of vias connecting a first one of the plurality of conductive interconnects to the at least two of the two or more concentric coils.

2. The semiconductor device of claim 1, wherein one of the two or more concentric coils has a lack of electrical connections to a remainder of the two or more concentric coils.

3. The semiconductor device of claim 2, wherein the one of the two or more concentric coils is a conductive path for routing signals, power or ground.

4. The semiconductor device of claim 1, wherein the one of the two or more concentric coils is a guard ring.

5. The semiconductor device of claim 1, wherein the two or more concentric coils comprise a seed layer.

6. The semiconductor device of claim 1, wherein the semiconductor device is a mobile semiconductor device.

7. A semiconductor device comprising:
a first conductive coil over a substrate;
a second conductive coil surrounding the first conductive coil;
a third conductive coil surrounding the second conductive coil, wherein the first conductive coil, the second conductive coil and the third conductive coil form an inductor, wherein the inductor comprises:
a first cross-sectional view in which a first conductive member is connected to both the first conductive coil and the second conductive coil through a first via and a second via; and
a second cross-sectional view in which a second conductive member extends beneath both the second coil and the third conductive coil, the second conductive member being fully surrounded by dielectric material.

8. The semiconductor device of claim 7, wherein the third conductive coil is electrically connected to a metallization layer.

9. The semiconductor device of claim 7, wherein the third conductive coil is a guard ring.

10. The semiconductor device of claim 7, wherein there is a lack of electrical connections which separates the third conductive coil from the second conductive coil.

11. The semiconductor device of claim 7, wherein the third conductive coil comprises a first seed layer.

12. The semiconductor device of claim 11, wherein the second conductive coil comprises a second seed layer, wherein the first seed layer has a first composition and the second seed layer has the first composition.

13. The semiconductor device of claim 12, wherein the first conductive coil comprises a third seed layer, the third seed layer having the first composition.

14. The semiconductor device of claim 7, wherein the first via has a first width and a second width different from the first width.

15. A semiconductor device comprising:
a semiconductor substrate;
a first set of vias located over the semiconductor substrate, each of the first set of vias having a longitudinal axis at a perpendicular angle to the semiconductor substrate;
a first coil in physical contact with a first one of the first set of vias;
a second coil in physical contact with a second one of the first set of vias;
a first conductive connector in physical contact with both the first one of the first set of vias and the second one of the first set of vias, the first conductive connector being on an opposite side of the first set of vias than the first coil; and
a second conductive connector in a same metallization layer as the first conductive connector, the second conductive connector being located directly between the second coil and the semiconductor substrate, the second conductive connector being isolated.

16. The semiconductor device of claim 15, wherein a first one of the first set of vias has a first width and a second width different from the first width.

17. The semiconductor device of claim 15, further comprising a third coil surrounding the first coil and the second coil.

18. The semiconductor device of claim 17, wherein the third coil is a guard ring.

19. The semiconductor device of claim 17, wherein the first coil has a first composition, the second coil has the first composition, and the third coil has the first composition.

20. The semiconductor device of claim 15, wherein the first coil comprises a seed layer.

* * * * *